United States Patent
Nakai

(10) Patent No.: US 11,417,524 B2
(45) Date of Patent: Aug. 16, 2022

(54) MANUFACTURING METHOD OF A GROUP III-V COMPOUND SEMICONDUCTOR DEVICE

(71) Applicant: Mitsubishi Electric Corporation, Tokyo (JP)

(72) Inventor: Eiji Nakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/978,969

(22) PCT Filed: May 24, 2018

(86) PCT No.: PCT/JP2018/019923
§ 371 (c)(1),
(2) Date: Sep. 8, 2020

(87) PCT Pub. No.: WO2019/224966
PCT Pub. Date: Nov. 28, 2019

(65) Prior Publication Data
US 2020/0411316 A1    Dec. 31, 2020

(51) Int. Cl.
*H01L 21/02* (2006.01)

(52) U.S. Cl.
CPC .... *H01L 21/02581* (2013.01); *H01L 21/0262* (2013.01); *H01L 21/02538* (2013.01)

(58) Field of Classification Search
None
See application file for complete search history.

(56) References Cited

U.S. PATENT DOCUMENTS 5,827,365 A * 10/1998 Shimoyama ...... H01L 21/02576
                                                    117/94

FOREIGN PATENT DOCUMENTS

| JP | H02-241030 A | 9/1990 |
| JP | H06-104195 A | 4/1994 |
| JP | H06-310449 A | 11/1994 |
| JP | 2014-011348 A | 1/2014 |

OTHER PUBLICATIONS

International Search Report issued in PCT/JP2018/019923; dated Jul. 31, 2018.
A. Van Geelen et al.; "Zinc Doping of InP by Metal Organic Vapour Phase Diffusion (MOVPD)"; Journal of Crystal Growth; 1998; pp. 79-84; vol. 195.

* cited by examiner

*Primary Examiner* — Bo B Jang
(74) *Attorney, Agent, or Firm* — Studebaker & Brackett PC

(57) ABSTRACT

A manufacturing method of a group III-V compound semiconductor device, the method includes: a first process in which a group V material gas and an impurity material gas are supplied to a reacting furnace which is set at a first temperature of a range from 400° C. to 500° C. and a first pressure of a range from 100 hPa to 700 hPa, and impurities are doped in an undoped group III-V compound semiconductor layer, and a second process in which the supply of the impurity material gas is stopped, a temperature of the reacting furnace is raised to a second temperature which is higher than the first temperature, a pressure of the reacting furnace is set lower than a pressure of the first pressure, a supply of an etching gas is initiated and the supply of the group V material gas is continued.

9 Claims, 13 Drawing Sheets ized separation among respective elements which are to be integrated is commonly performed at the time of a process. On this occasion, the diffusion technology of impurities is effective also as a method to selectively diffuse impurities and to increase the resistance. In particular, the vapor phase diffusion method which employs a vapor phase growth apparatus is referred to as an open tube method. This open tube method is a useful vapor phase diffusion method, from the great heights in the throughput and the diffusion controllability.

MANUFACTURING METHOD OF A GROUP III-V COMPOUND SEMICONDUCTOR DEVICE

FIELD OF THE INVENTION

The present application relates to a manufacturing method of a compound semiconductor device, and in particular, relates to a method for doping impurities in a group III-V compound semiconductor with the use of a vapor phase diffusion method.

BACKGROUND OF THE INVENTION

Diffusion technology of impurities can be cited as an important technology of a device in which group III-V compound semiconductor is used. For example, when the diffusion technology of zinc (Zn) is used in optical devices, such as a photo diode (PD), an avalanche photodiode (APD), a Fabry Perot (FP) type laser, and a distributed feedback (DFB) type laser, p type regions can be formed in a highly controllable way (for example, refer to Patent Document 1 and Patent Document 2).

Further, a plurality of functions are integrated in electronic devices, optical devices and others, and then, electrically insulated separation among respective elements which are to be integrated is commonly performed at the time of a process. On this occasion, the diffusion technology of impurities is effective also as a method to selectively diffuse impurities and to increase the resistance. In particular, the vapor phase diffusion method which employs a vapor phase growth apparatus is referred to as an open tube method. This open tube method is a useful vapor phase diffusion method, from the great heights in the throughput and the diffusion controllability.

In Patent Document 2, statements are made about the vapor phase diffusion method of zinc (Zn) which is used in an organic metal vapor phase growth apparatus. The matter of concern, which is taken up there, is that, the size of a specimen is restricted according to the closed tube method in which a quartz ampule tube is used, and then, a larger area of the specimen is difficult to attain, and moreover, very few methods can control the diffusion, and then, there are variations in the diffusion concentration and the diffusion depth. In this patent document, an open tube method is proposed as a solution to the closed tube method in which a quartz ampule tube is used.

According to this proposal, first of all, the undope growth of an InP cladding layer and an InGaAs contact layer, or an InP cladding layer and an InGaAsP contact layer, is carried out on an n type InP base substrate. In the next process, AsH$_3$, PH$_3$, DMZn (Dimethyl Zinc), and H$_2$ are introduced for 30 minutes in the reacting furnace of a vapor phase growth apparatus which is set at 400° C., and zinc (Zn) is doped in the undoped layers. A base substrate having a maximum diameter that the furnace can accept is used as the one to be introduced into the reacting furnace of the vapor phase growth apparatus, and the greatest number of those base substrates that the reacting furnace can accept are introduced at once into the reacting furnace. According to this open tube method, the diffusion depth of zinc (Zn) with respect to a diffusion time can be restricted to 1/5 or so, compared with that of the closed tube method.

Further, in Non-patent Document 1, shown are results on a photo diode, which has been fabricated by way of trial, using an organic metal vapor phase growth apparatus in a similar manner. Descriptions can be found that the controllability and the reproducibility are improved, in that gases can be fine controlled in the flow rate and switching. Here, the inside of the reacting furnace of the vapor phase growth apparatus is set at 475 to 550° C., and also at 900 hPa (900 mbar). It is shown that AsH$_3$, PH$_3$, DEZn (Diethyl Zinc), and H$_2$ were introduced on the inside of the reacting furnace to perform the diffusion, and a pin-InGaAs photo diode was produced, and thereby, values in reverse current were achieved in a highly reproducible way, compared with those by the diffusion method in an ampule tube.

CITATION LIST

Patent Literature

Patent Document 1: JP H6-104195, A
Patent Document 2: JP H6-310449, A
Patent Document 3: JP 2014-11348, A

Non-Patent Literature

Non-patent Document 1: Journal of Crystal Growth 195, 79 (1998)

SUMMARY OF THE INVENTION

Technical Problem

As mentioned above, among the manufacturing methods of a compound semiconductor device, the vapor phase diffusion method is used as a method for carrying out densely concentrated doping in a highly controllable way. For example, the vapor phase diffusion method is employed for an InGaAs contact layer and an InP cladding layer, both of which are grown undoped, to form a p typed sample on the inside of the reacting furnace, which are heated to 450° C. FIG. 1 shows a result of SIMS (Secondary Ion Mass Spectrometry) analysis which was conducted on this sample. From this graph, it can be confirmed that zinc (Zn) with a concentration of $1\times10^{19}$ cm$^{-3}$ or more is doped in the InGaAs contact layer, and zinc (Zn) with a concentration in the vicinity of $1\times10^{18}$ cm$^{-3}$ is doped in the InP cladding layer.

However, it is described in the first embodiment of Patent Document 3 that, the process for diffusing Zn in the InGaAs layer was performed, and thereby, the crystalline nature of an InGaAs layer is lowered and the surface is roughened, and then, the adhesion property of the InGaAs layer with an electrode is deteriorated after the process for diffusing Zn is performed. In this way, the surface of a base substrate is deteriorated in the crystalline nature or the morphology, immediately after the diffusion process is finished. The deterioration in the crystalline nature or the morphology on the surface of a base substrate lowers the diffusion controllability in a direction of the base substrate and a direction perpendicular to the base substrate, that is, even the controllability of doping. In Patent Document 3, it is described as a solution to this problem that, an InGaAs layer is removed and a contact layer which consists of InGaAs is formed again on the cladding layer. However, the process, in which an InGaAs contact layer is removed and an InGaAs contact layer is grown again, is unsuitable as a mass production line, because of the concern for the InGaAs etching residues due to the influence of surface residual substances, and the increase in the number of processes, and the like.

The present application is the one that discloses a technology for overcoming the above mentioned issues and others, and, by means of simple processes, aims at suppressing the deterioration in the crystalline nature and the morphology, on the surface of a base substrate by the diffusion process, and at realizing the doping in which the controllability is improved.

Solution to Problem

A manufacturing method of a group III-V compound semiconductor device which is disclosed in the present application, is the one which includes:
a first process in which a group V material gas and an impurity material gas are supplied to a reacting furnace which is set at a first temperature of a range from 400° C. to 500° C. and a first pressure of a range from 100 hPa to 700 hPa, and impurities are doped in an undoped group III-V compound semiconductor layer, and
a second process in which the supply of the impurity material gas is stopped, a temperature of the reacting furnace is raised to a second temperature which is higher than the first temperature, a pressure of the reacting furnace is set lower than a pressure of the first pressure, a supply of an etching gas is initiated and the supply of the group V material gas is continued.

Further, a manufacturing method of a group III-V compound semiconductor device which is disclosed in another embodiment of the present application, is the one which includes:
a first process in which a group V material gas, an impurity material gas and a halogenated reactive gas as an etching gas are supplied to a reacting furnace which is set at a first temperature of a range from 400° C. to 500° C. and a first pressure of a range from 100 hPa to 700 hPa, and impurities are doped in an undoped group III-V compound semiconductor layer, and
a second process in which the supply of the impurity material gas is stopped, a temperature of the reacting furnace is raised to a second temperature which is higher than the first temperature, a pressure of the reacting furnace is set lower than a pressure of the first pressure, the supply of the group V material gas and the supply of the etching gas are continued.

Further, a manufacturing method of a group III-V compound semiconductor device which is disclosed in another embodiment of the present application, is the one which includes:
a first process in which a group V material gas and an impurity material gas are supplied to a reacting furnace which is set at a first temperature of a range from 40° C. to 500° C. and a first pressure of a range from 100 hPa to 700 hPa, and impurities are doped in an undoped group III-V compound semiconductor layer, and
a second process in which the supply of the impurity material gas and the supply of the etching gas are stopped, a temperature of the reacting furnace is raised to a second temperature which is higher than the first temperature and the supply of the group V material gas is continued.

Further, a manufacturing method of a group III-V compound semiconductor device which is disclosed in another embodiment of the present application, is the one which includes:
a first process in which a group V material gas and an impurity material gas and a halogenated reactive gas as an etching gas are supplied to a reacting furnace which is set at a temperature of a range from 400° C. to 500° C. and a pressure of a range from 100 hPa to 700 hPa, and impurities are doped in an undoped group III-V compound semiconductor layer.

Advantageous Effects of Invention

The manufacturing method of a group III-V compound semiconductor device which is disclosed in the present application, is the one which includes:
a first process in which a group V material gas and an impurity material gas are supplied to a reacting furnace which is set at a first temperature, and impurities are doped in an undoped group III-V compound semiconductor layer, and
a second process in which the supply of the impurity material gas is stopped, a temperature of the reacting furnace is raised to a second temperature which is higher than the first temperature, and the supply of the group V material gas is continued.

Thereby, the generation of surface residual substances can be suppressed on the inside of a reacting furnace, and, by means of simple processes, the deterioration in the crystalline nature and the morphology on the surface of a base substrate by the diffusion process can be suppressed, and the doping with improved controllability can be realized.

Further, the manufacturing method of a group III-V compound semiconductor device which is disclosed in another embodiment of the present application, is the one which includes:
a first process in which a group V material gas and an impurity material gas and an etching gas are supplied to a reacting furnace which is set at a first temperature, and impurities are doped in an undoped group III-V compound semiconductor layer.

Thereby, residual substances can be removed, by the time when the compound semiconductor base substrate is took out from a vapor phase growth apparatus, and, by means of simple processes, the deterioration in the crystalline nature and the morphology on the surface of a base substrate by the diffusion process can be suppressed, and the doping with improved controllability can be realized.

DETAILED DESCRIPTION OF THE INVENTION

Figure 1:
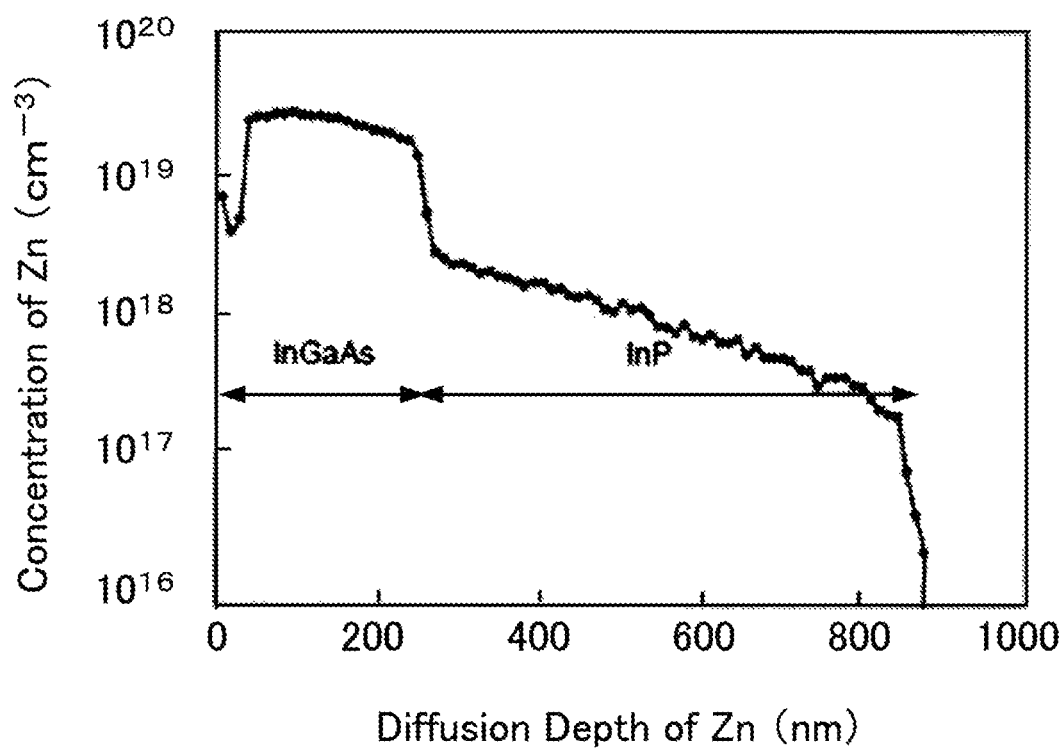
FIG. 1 is a drawing showing the result of a SIMS analysis which is conducted on a group III-V compound semiconductor device.

According to the doping by the vapor phase diffusion method, residual substances will be generated on the surface of a base substrate, when the flow rate of an impurity material gas (diffusion material gas) which becomes diffusion source and the pressure on the inside of a reacting furnace and the like are raised in order to increase diffusion velocity. Those residual substances generated on the surface of a base substrate are the ones which are attributed to the diffusion source, and cause the deterioration in the surface morphology. Furthermore, when an insulating mask is formed on the surface of a base substrate for selective diffusion, it is observable that the generation of residual substances tends to become more evident, as the area of an opening portion becomes smaller and smaller.

The residual substances on the surface of a base substrate exert an influence on a subsequent process. In addition, the generation of residual substances produces a state in which output products, whose main elements are impurities and group V material gas, are deposited on the surface. For this reason, unexpected impurity diffusion is generated also during the fall in temperature, which is performed subsequent to the diffusion process, and the diffusion depth is reduced in the controllability and reproducibility. As a result, it becomes probable that the profile in concentration cannot be secured in the controllability and reproducibility.

After the above issues are taken into consideration, gained is a knowledge that, when the generation of the residual substances on the surface of a base substrate is suppressed, or the generated residual substances are removed, the profile in concentration can be secured in the controllability and reproducibility.

Hereinafter, embodiments with regard to a method for suppressing the generation of residual substances on the surface of a base substrate, or removing the generated residual substances, will be described with reference to drawings. Incidentally, the same reference numerals are given to those identical or similar to constitutional portions in respective drawings and the size and/or the scale size of the corresponding respective constitutional portions are respectively independent. For example, when the identical constitutional portions, which are not changed, are shown, the size and/or the scale size of the identical constitutional portions may be different among sectional views in which a part of the configuration is changed. Furthermore, although the manufacturing method of a group III-V compound semiconductor device is actually further provided with a plurality of processes, for ease of explanation, only portions necessary for explanation will be described and other portions are omitted.

Embodiment 1

Figure 2:
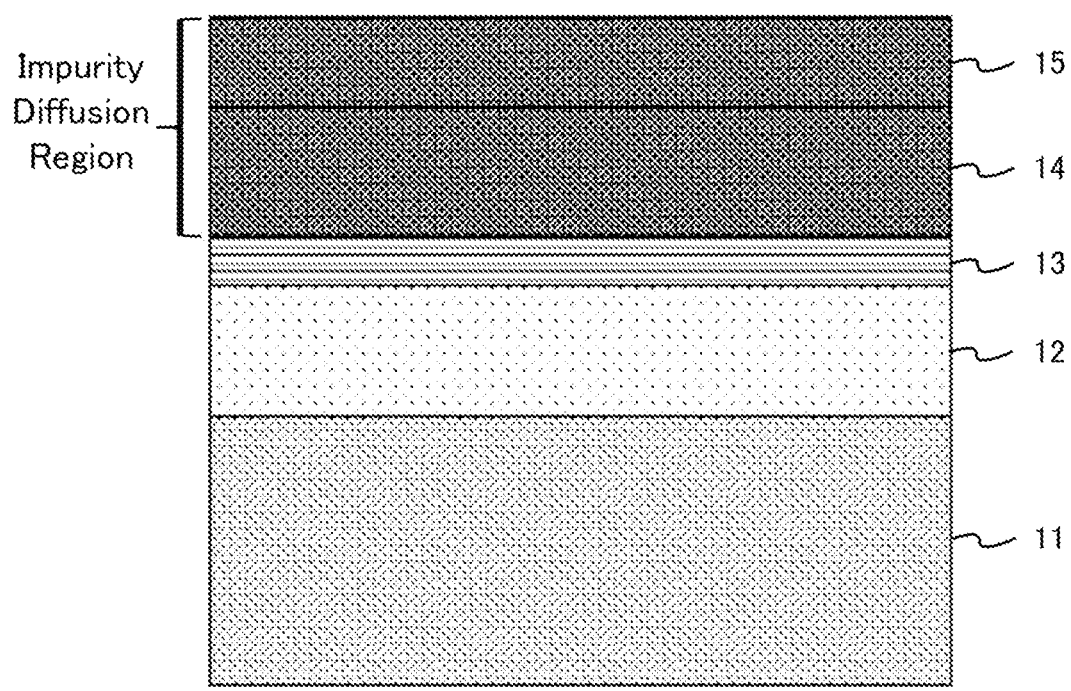
FIG. 2 is a section drawing for explaining the structure of a core part, with regard to a group III-V compound semiconductor device in accordance with the present embodiments.

Hereinafter, explanation will be made about a manufacturing method of a group III-V compound semiconductor device in accordance with embodiments, with reference to drawings. FIG. 2 is a sectional structure drawing showing the principal part of an optical semiconductor device 100 in accordance with the embodiments of the present application. A semiconductor laser, which is an example of the optical semiconductor device 100, consists of an n type InP base substrate 11, an n type InP cladding layer 12, an active layer 13, a cladding layer 14 (InP cladding layer), a contact layer 15 (InGaAs contact layer or InGaAsP contact layer), and others.

In the group III elements, there exist boron (B), aluminum (Al), gallium (Ga), indium (In), and the like. Those elements which constitute compound semiconductor are, mainly, aluminum, gallium, and indium. In the group V elements, there exist nitrogen (N), phosphorus (P), arsenic (As), antimony (Sb), and the like. Those elements which constitute compound semiconductor are, mainly, nitrogen, phosphorus, and arsenic, and rarely used is antimony. In the representative group III-V compound semiconductors, there exist gallium arsenide (GaAs), gallium nitride (GaN), indium phosphorus (InP), and the like.

The diffusion technology of impurities can be cited as an important technology for manufacturing a device in which the group III-V compound semiconductor is used. When the diffusion technology of zinc (Zn) is used in light receiving elements (a photo diode, an avalanche photodiode, and the like) and light emitting devices (a Fabry Perot type laser, a distributed feedback laser, and the like), p type regions can be formed. Further, the diffusion technology of impurities can be used as a means to perform the electrically insulated separation among respective elements which are to be integrated, at the time when processes are implemented on an electronic device, an optical device and the like, in all of which a plurality of functions are integrated.

As for the compound semiconductor base substrate of a diffusion target, when the optical semiconductor device has a laser structure, after an n type InP cladding layer is formed on an n type InP base substrate, an active layer is grown thereon. Subsequent to this process, an undoped cladding layer (i-InP cladding layer) and a contact layer (i-InGaAs contact layer or i-InGaAsP contact layer), in both of which impurities are not doped intentionally, will be stacked thereon. The vapor phase diffusion method is directly enforced on the inside of a crystal growth apparatus, or the base substrate is once took out from the inside of the furnace, and then, an insulating mask for selective diffusion is formed thereon.

Figure 3:
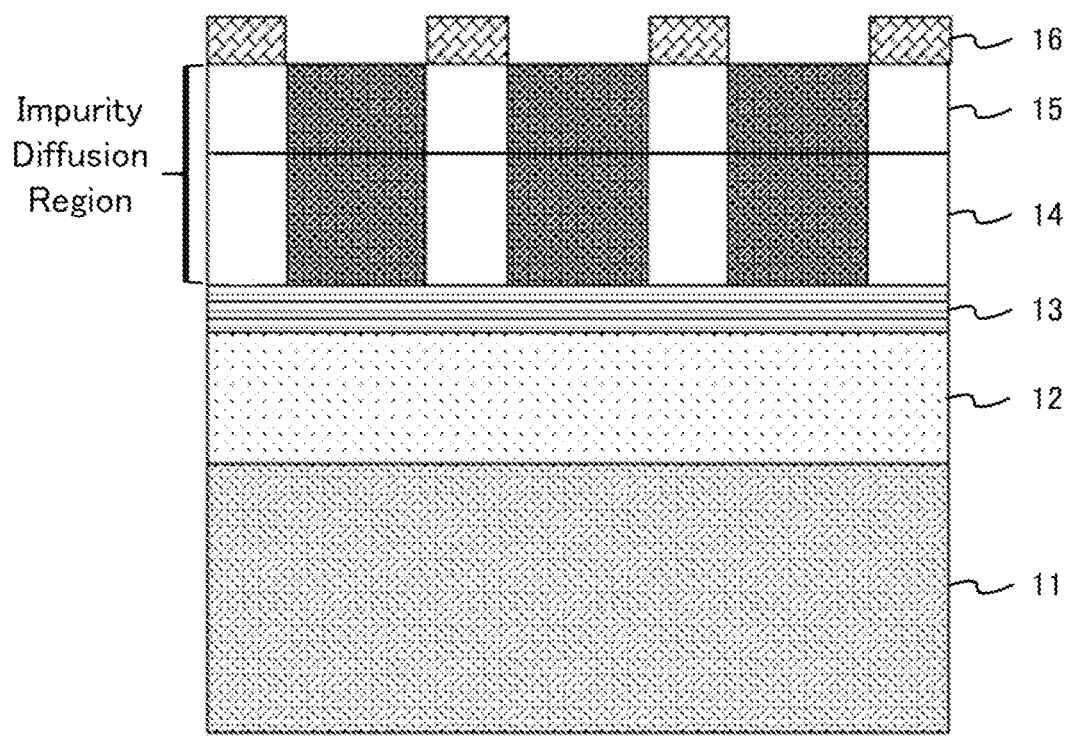
FIG. 3 is a section drawing for explaining selective diffusion, in the group III-V compound semiconductor device in accordance with the present embodiments.

Next, explanation will be made about the selective diffusion, with reference to FIG. 3. In the drawing, shown are an n type InP base substrate 11, an n type InP cladding layer 12, an active layer 13, a cladding layer 14, a contact layer 15, and an insulating mask 16. The insulating mask 16, which was used for the selective diffusion, is formed on the contact layer 15. After the insulating mask 16 is formed, the base substrate is introduced again into the crystal growth apparatus, and the vapor phase diffusion method is enforced to form p type regions.

Figure 4:
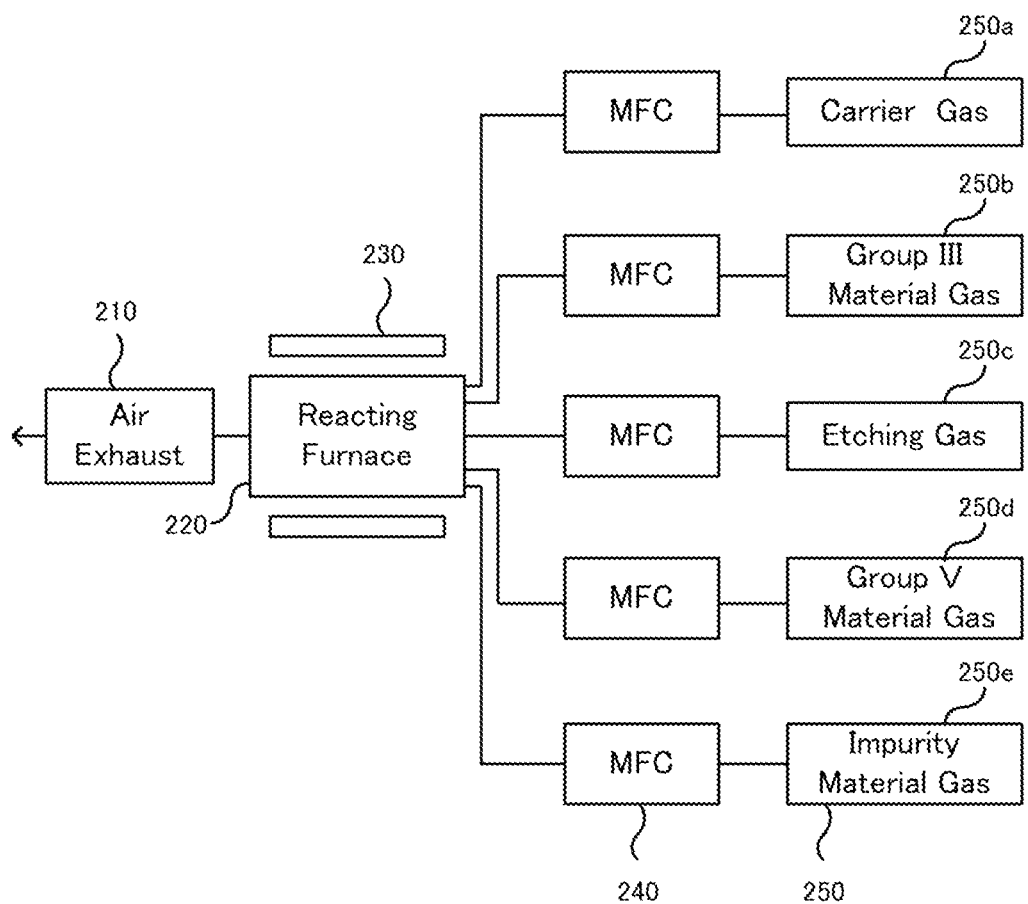
FIG. 4 is a schematic diagram for explaining the structure of a crystal growth apparatus in accordance with the present embodiments.

FIG. 4 is a schematic diagram which represents a vapor phase growth apparatus 200, in which the vapor phase diffusion method is enforced. The vapor phase growth apparatus 200 is composed of an air exhaust 210, a reacting furnace 220, heaters 230, mass flow controllers (MFCs) 240, gas containers 250, and others. The internal temperature of the reacting furnace 220 can be adjusted by operating the heaters 230. The internal pressure of the reacting furnace 220 can be adjusted to a constant value, by adjusting the air exhaust 210 or the mass flow controllers 240. The use of this vapor phase growth apparatus 200 can provide the supply of a carrier gas 250$a$, a group III material gas 250$b$, an etching gas 250$c$, a group V material gas 250$d$, an impurity material gas 250$e$, and the like.

First of all, after an n type InP cladding layer 12 is formed on an n type InP base substrate 11, an active layer 13 is grown thereon. Subsequent to this process, a cladding layer (i-InP cladding layer) and a contact layer (i-InGaAs contact layer or i-InGaAsP contact layer), in both of which impurities are not doped intentionally, will be stacked thereon. Subsequent to this process, the group V material gas, the impurity material gas, and the carrier gas ($H_2$) are introduced on the inside of the reacting furnace 220, and impurity diffused layers are produced by the vapor phase diffusion method.

Figure 5:
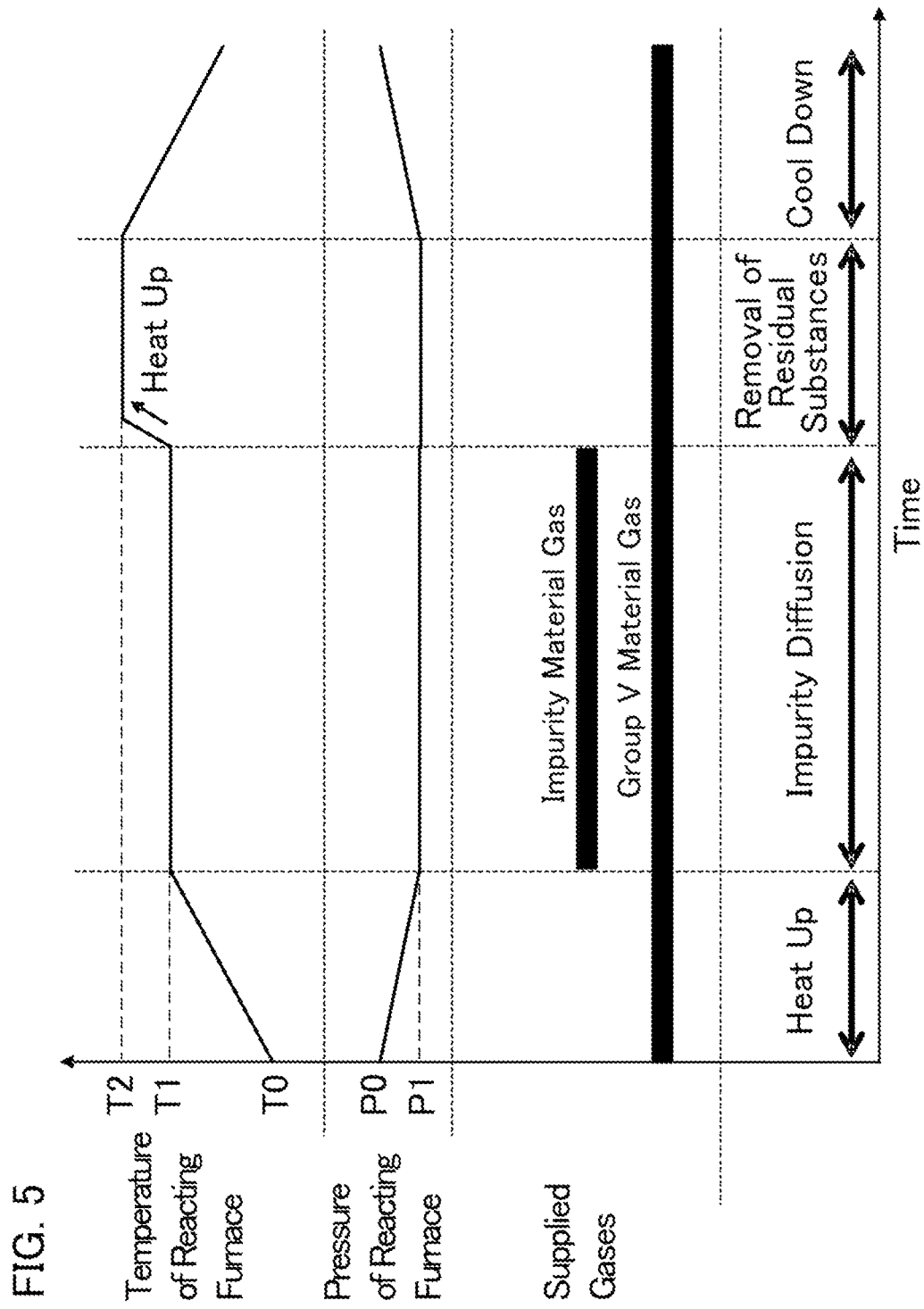
FIG. 5 is a process flow chart for explaining the principal part of a manufacturing method of a group III-V compound semiconductor device in accordance with Embodiment 1.

FIG. 5 shows a process flow chart for explaining the principal part of the vapor phase diffusion method which is performed in the crystal growth apparatus. Simultaneously with the introduction of the carrier gas ($H_2$), the impurity material gas (diffusion material gas) and the group V material gas are supplied on the inside of the furnace which is set at a predetermined temperature (temperature T1: first temperature) and at a predetermined pressure (pressure P1: first pressure), and thereby, impurities can be diffused in the undoped contact layer and the undoped cladding layer (first process).

When p type regions are formed in the undoped contact layer 15 and the undoped cladding layer 14, for example, diethyl zinc (Diethyl Zinc: DEZn) or dimethyl zinc (Dimethyl Zinc: DMZn) is used for the impurity material gas. For example, $AsH_3$ or $PH_3$ is used for the group V material gas. The temperature to perform the diffusion (first temperature) is, for example, 400 to 500° C., and the internal pressure (first pressure) of the reacting furnace 220 is 100 to 700 hPa (100 to 700 mbar).

After the impurity diffusion is carried out for a desired time, with the impurity material gas (diffusion material gas) being supplied on the inside of the furnace, the supply of the impurity material gas (diffusion material gas) is stopped, and the temperature on the inside of the furnace is set at a temperature T2 (second temperature). The second temperature needs to be set at a high value, compared with that of the impurity diffusion process. The state of the furnace, where the temperature on the inside of the furnace is raised from the temperature T1 of the diffusion performing time to the temperature T2, is kept for a definite period of time, to remove residual substances (second process). For example, in the case where the temperature of the reacting furnace is 450° C. at the diffusion time, and the pressure there is 700 hPa (700 mbar), the temperature of the reacting furnace is set at 600° C. (T2). After the residual substance removal process is finished, the inside of the furnace is returned to a normal pressure and a normal temperature. Here, the second temperature needs to be set at a temperature at which residual substances can be removed, and it is dependent on various conditions, such as, the material of a layer to which impurities are diffused, the species of the impurity, the temperature in the impurity diffusion process, the time to maintain the second temperature, and so on. However, it is preferable to set the second temperature by at least 50° C. high or more, compared with the temperature (first temperature) of the impurity diffusion process.

When the impurity diffusion is carried out at a low temperature so that the crystalline nature of a target compound semiconductor may not be spoiled, or when the flow rate of the impurity material gas which becomes diffusion source is raised in order to increase the diffusion velocity, residual substances of the diffusion source origin will be produced on the surface of a base substrate. These residual substances deteriorate the surface morphology. Moreover, when an insulating mask is formed on the surface of a base substrate for the purpose of selective diffusion, it is observable that the generation of the residual substances tends to become more evident, as the area of an opening portion becomes smaller and smaller.

According to the manufacturing method of a group III-V compound semiconductor device which is disclosed in the present embodiment, simultaneously with the introduction of the carrier gas ($H_2$), the impurity material gas (DEZn, DMZn, and the like) and the group V material gas ($AsH_3$, $PH_3$, and the like) are supplied on the inside of a furnace, and the diffusion is performed, and after that, the supply of the impurity material gas is stopped, and the state of the furnace is kept for a definite period of time, where the temperature on the inside of the furnace is raised from the temperature of the diffusion performing time. Owing to these procedures, the generation of the residual substances can be suppressed, and thereby, the controllability and the reproducibility can be secured in the concentration profile of impurities.

The vapor phase diffusion method in a vapor phase growth apparatus is a technology in which the impurity material gas (diffusion material gas) and the group V material gas are reacted on the surface of a compound semiconductor, and impurities are diffused in a target compound semiconductor. The reaction on the surface of a compound semiconductor is promoted and decomposed materials initiate the accumulation, and thereby, the morphology on the surface becomes deteriorated. The supply of the impurity material gas is stopped, and thereby, newly generation of the residual substances are suppressed, and further, the temperature on the inside of the furnace is raised from that of the diffusion time, and thereby, the vapor pressure of the diffusion residual substances which are deposited on the surface is increased and a state is created in which residual substances are easy to desorb from a surface. Owing to these, output products whose main element is the impurity are removed from a surface subsequent to the diffusion, and the diffusion during the fall in temperature is suppressed, and then, the controllability can be secured.

The present embodiment is related with a manufacturing method of a compound semiconductor device, which is provided with a process in which, in the process of performing the doping of impurities by the vapor phase diffusion method, the group V material gas and the impurity material gas are supplied on the inside of a heated-up reacting furnace, and impurities are doped and diffused in a compound semiconductor layer, and subsequently to that, as a residual substance removal process, the supply of the impurity material gas (diffusion material gas) is stopped, with the group V material gas being supplied; and a process in which the temperature on the inside of the reacting furnace is raised from that of the diffusion process. Owing to these procedures, the controllability in the impurity diffusion can be improved, and further, the surface morphology can be obtained which is capable of enduring even in the subsequent, crystal growth process, film production process, and electrode formation process.

The manufacturing method of a group III-V compound semiconductor device which is disclosed in the present application, is the one which includes:

a first process in which a group V material gas and an impurity material gas are supplied to a reacting furnace which is set at a first temperature, and impurities are doped in an undoped group III-V compound semiconductor layer, and a second process in which the supply of the impurity material gas is stopped, a temperature of the reacting furnace is raised to a second temperature which is higher than the first temperature, and the supply of the group V material gas is continued.

Embodiment 2

The manufacturing method of a group III-V compound semiconductor device in accordance with Embodiment 2 has a feature in that, in the manufacturing method of a compound semiconductor device in accordance with Embodiment 1, the state of the reacting furnace is kept for a definite period of time, where the pressure on the inside of the reacting furnace is lowered, in coincident with the heat up in the residual substance removal process, which is performed subsequent to the diffusion.

First of all, after an n type InP cladding layer 12 is formed on an n type InP base substrate 11, an active layer 13 is grown thereon. Subsequent to this process, a cladding layer 14 (i-InP cladding layer) and a contact layer 15 (i-InGaAs contact layer or i-InGaAsP contact layer), in both of which impurities are not doped intentionally, will be stacked thereon. Subsequent to this process, the group V material gas, the impurity material gas, and the carrier gas ($H_2$) are introduced on the inside of the reacting furnace 220, and impurity diffused layers are produced by the vapor phase diffusion method.

Figure 6:
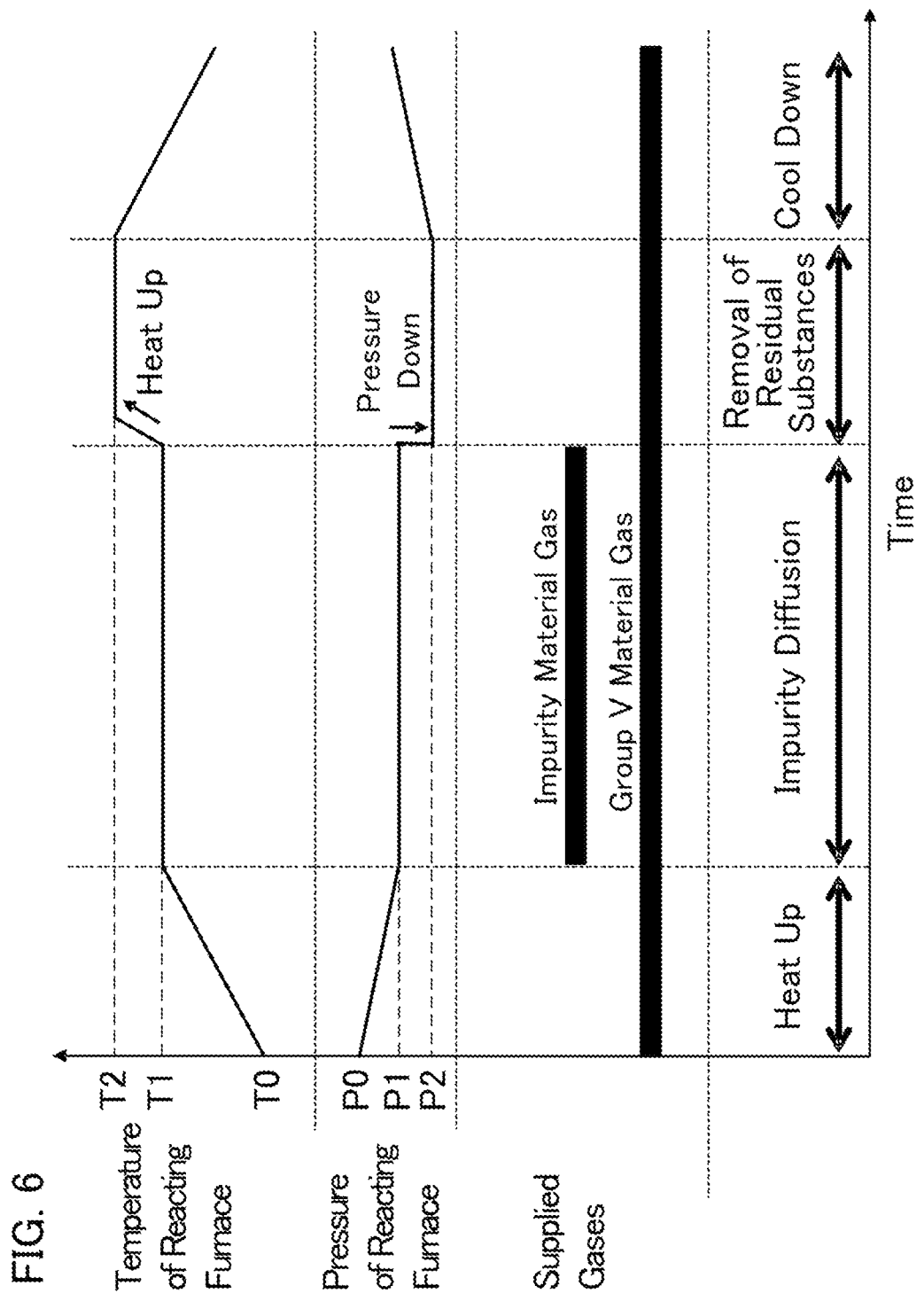
FIG. 6 is a process flow chart for explaining the principal part of a manufacturing method of a group III-V compound semiconductor device in accordance with Embodiment 2.

FIG. 6 shows a process flow chart for explaining the principal part of the vapor phase diffusion method which is performed in the crystal growth apparatus. When the undoped contact layer 15 and the cladding layer 14 need to be changed into p typed ones, the inside of the furnace is heated up from a temperature T0 to a temperature T1, and the pressure on the inside of the furnace is changed from a pressure P0 to a pressure P1, to attain the state of a reduced pressure, rather than that of an atmospheric pressure. Simultaneously with the introduction of the carrier gas ($H_2$), the impurity material gas (diffusion material gas) and the group V material gas are supplied on the inside of the furnace, and thereby, impurities can be diffused in the undoped contact layer 15 and the undoped cladding layer 14.

When p type regions are formed in the undoped contact layer 15 and the undoped cladding layer 14, for example, diethyl zinc (Diethyl Zinc: DEZn) or dimethyl zinc (Dimethyl Zinc: DMZn) is used for the impurity material gas. For example, $AsH_3$ or $PH_3$ is used for the group V material gas. The temperature to perform the diffusion is, for example, 400 to 500° C., and the internal pressure of the reacting furnace 220 is 100 to 700 hPa (100 to 700 mbar).

After the impurity diffusion is carried out for a desired time, with the impurity material gas (diffusion material gas) being supplied on the inside of the furnace, the supply of the impurity material gas (diffusion material gas) is stopped. Moreover, the inside of the furnace is heated up from the temperature T1 to a temperature T2 (second temperature), to attain a temperature which is higher than that of the diffusion time, and in addition, the inside of the reacting furnace is lowered from the pressure P1 (first pressure) to the pressure P2 (second pressure), and the state of the furnace is kept for a definite period of time, to remove the residual substances.

For example, in the case where the temperature of the reacting furnace is 450° C. and the pressure is 700 hPa (700 mbar), at the time when the impurity diffusion is performed, the temperature of the reacting furnace is set at 600° C. and the pressure of the reacting furnace is set at 100 hPa (100 mbar). After this residual substance removal process is finished, the temperature on the inside of the furnace is lowered slowly, while the pressure on the inside of the furnace is returned to an atmospheric pressure. Here, the second temperature needs to be set at a temperature at which residual substances can be removed, and it is dependent on various conditions, such as, the material of a layer to which impurities are diffused, the species of the impurity, the temperature in the impurity diffusion process, the time to maintain the second temperature, and so on. However, it is preferable to set the second temperature to a value, which is high by at least 50° C. or more, compared with that of the impurity diffusion process. Further, even when the least amount of pressure possible is lowered from the first pressure, a certain level of effect will be gained, and it is, however, preferable to lower the second pressure by 50 hPa or more.

The present embodiment is related with the manufacturing method of a compound semiconductor device, which is, in Embodiment 1, provided with a process in which the supply of the diffusion material gas is stopped, with the group V material gas being supplied, as a residual substance removal process after the diffusion is finished; and a process in which the pressure on the inside of the reacting furnace is lowered from that of the impurity diffusion process, simultaneously with performing the process for raising the temperature on the inside of the reacting furnace from that of the diffusion process. In addition to raising the temperature, lowering the pressure on the inside of the furnace makes a state, in which residual substances can desorb more easily. Further, the present embodiment is effective also in the case where, in order to suppress the diffusion of impurities which have been doped beforehand in the compound semiconductor base substrate, the temperature on the inside of the furnace cannot be raised beyond a certain constant temperature.

Embodiment 3

The manufacturing method of a group III-V compound semiconductor device in accordance with Embodiment 3 has a feature in that, in the manufacturing method of a compound semiconductor device in accordance with Embodiment 2, when the diffusion residual substances are removed a reactive gas, such as a hydrogen chloride (HCl) gas, is introduced on the inside of the furnace.

First of all, after an n type InP cladding layer 12 is formed on an n type InP base substrate 11, an active layer 13 is grown thereon. Subsequent to this process, a cladding layer 14 (i-InP cladding layer) and a contact layer 15 (i-InGaAs contact layer or i-InGaAsP contact layer), in both of which impurities are not doped intentionally, will be stacked thereon. Subsequent to this process, the group V material gas, the impurity material gas, and the carrier gas (112) are introduced on the inside of the reacting furnace 220, and impurity diffused layers are produced by the vapor phase diffusion method.

Figure 7:
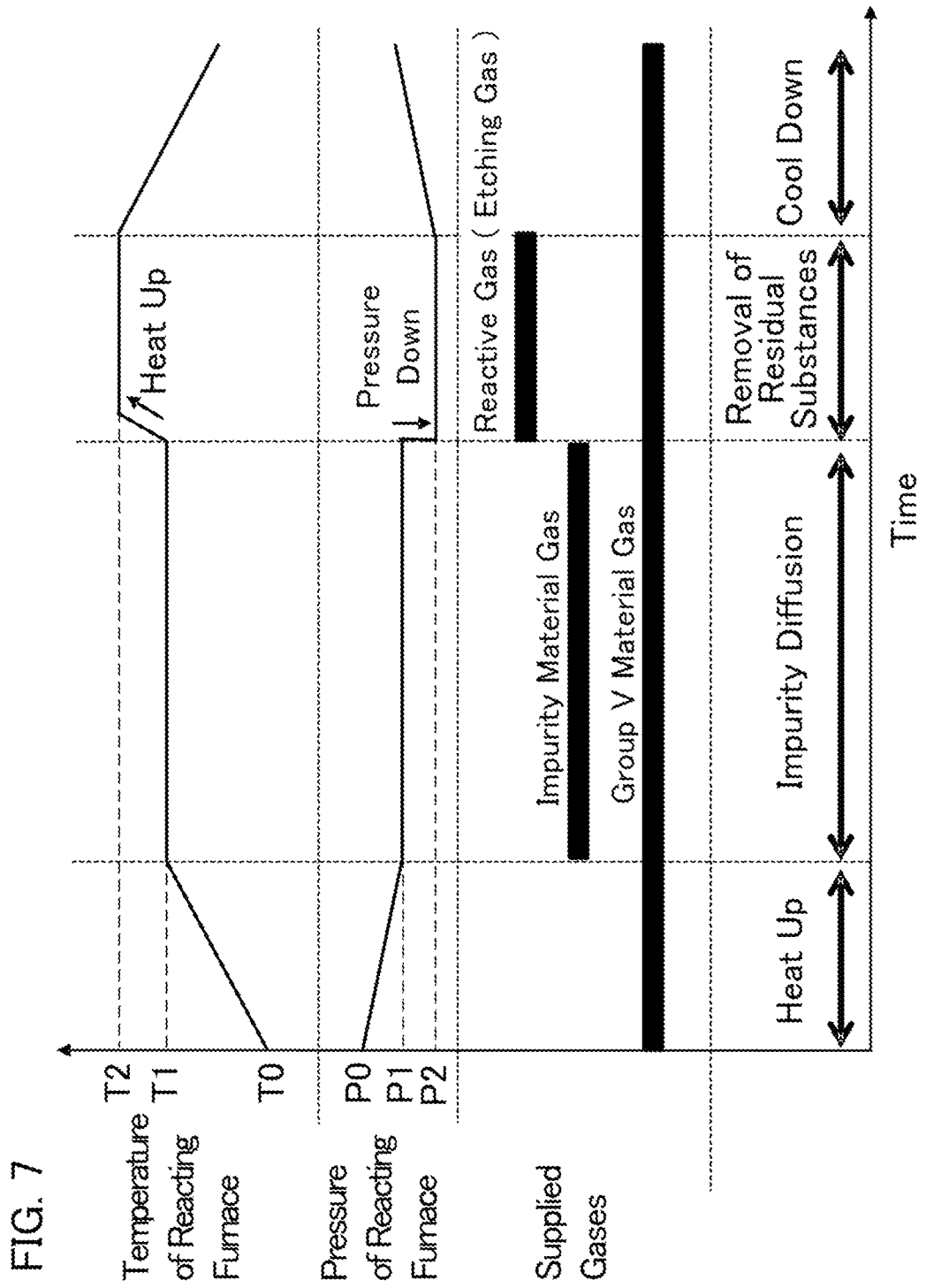
FIG. 7 is a process flow chart for explaining the principal part of a manufacturing method of a group III-V compound semiconductor device in accordance with Embodiment 3.

FIG. 7 shows a process flow chart for explaining the principal part of the vapor phase diffusion method which is performed in the crystal growth apparatus. When the undoped contact layer 15 and the undoped cladding layer 14 need to be changed into p typed ones, the inside of the furnace is heated up from a temperature T0 to a temperature T1, and the pressure on the inside of the furnace is lowered from a pressure P0 to a pressure P1. Simultaneously with the introduction of the carrier gas (112), the impurity material gas (diffusion material gas) and the group V material gas are supplied on the inside of the furnace, and thereby, impurities can be diffused in the undoped contact layer 15 and the undoped cladding layer 14.

When p type regions are formed in the undoped contact layer 15 and the undoped cladding layer 14, for example, diethyl zinc (Diethyl Zinc: DEZn) or dimethyl zinc (Dimethyl Zinc: DMZn) is used for the impurity material gas. For example, $AsH_3$ or $PH_3$ is used for the group V material gas. The temperature to perform the diffusion is, for example, 400 to 500° C., and the internal pressure of the reacting furnace 220 is 100 to 700 hPa (100 to 700 mbar).

After the impurity diffusion is carried out for a desired time, with the impurity material gas (diffusion material gas) being supplied on the inside of the furnace, the supply of the impurity material gas (diffusion material gas) is stopped. Moreover, the inside of the furnace is heated up from the temperature T1 to a temperature T2 (second temperature), to attain a temperature which is higher than that of the diffusion time, and the pressure on the inside of the reacting furnace is lowered from the pressure P1 (first pressure) to the pressure P2 (second pressure), and the state of the furnace is kept for a definite period of time, to remove the residual substances. For example, in the case where the temperature of the reacting furnace is 450° C. and the pressure is 700 hPa (700 mbar), at the time when the impurity diffusion is performed, the temperature of the reacting furnace is set at 600° C. and the pressure of the reacting furnace is set at 100 hPa (100 mbar).

In the process of removing the residual substances, it is preferable that, the temperature of the reacting furnace is raised by at least 50° C. or more, compared with that of the process of impurity diffusion, and the pressure of the reacting furnace is lowered by 50 hPa or more. When the residual substance removal process is performed, the reactive gas is introduced. As for the reactive gas, etching gases of halogen system, such as HCl (hydrogen chloride), $TbCl_3$ (terbium trichloride), and the like, are preferably employed. Subsequent to this process, the temperature on the inside of the furnace is lowered slowly, while the pressure on the inside of the furnace is returned to a previous value.

The present embodiment is related with the manufacturing method of a compound semiconductor device, which is provided with a process in which, as a residual substance removal process, an etching gas is further introduced, after the diffusion process is finished. That is to say, when the second process starts, the supply of the etching gas is initiated. According to the present embodiment, the reactive gas of halogen system is supplied on the inside of the furnace, and thereby, it becomes possible to enhance the effect of removing the residual substances subsequent to the diffusion process.

Embodiment 4

In the manufacturing method of a compound semiconductor device in accordance with Embodiment 4, simultaneously with the introduction of 112 of the carrier gas, the impurity material gas (for example, DEZn or DMZn) and the group V material gas (for example, $AsH_3$ or $PH_3$) are supplied on the inside of the furnace, and thereby, the desorption of group V materials is suppressed, and then, impurities can be diffused, while the semiconductor crystalline nature is secured. In so doing, the reactive gas is introduced at the same time on the inside of the furnace. The group III material gas may be introduced at the same time.

First of all, after an n type InP cladding layer 12 is formed on an n type InP base substrate 11, an active layer 13 is grown thereon. Subsequent to this process, a cladding layer 14 (i-InP cladding layer) and a contact layer 15 (i-InGaAs contact layer or i-InGaAsP contact layer), in both of which impurities are not doped intentionally, will be stacked thereon. Subsequent to this process, the group V material gas, the impurity material gas, the carrier gas ($H_2$), and the reactive gas are introduced on the inside of the reacting furnace 220, and impurity diffused layers are produced by the vapor phase diffusion method.

Figure 8:
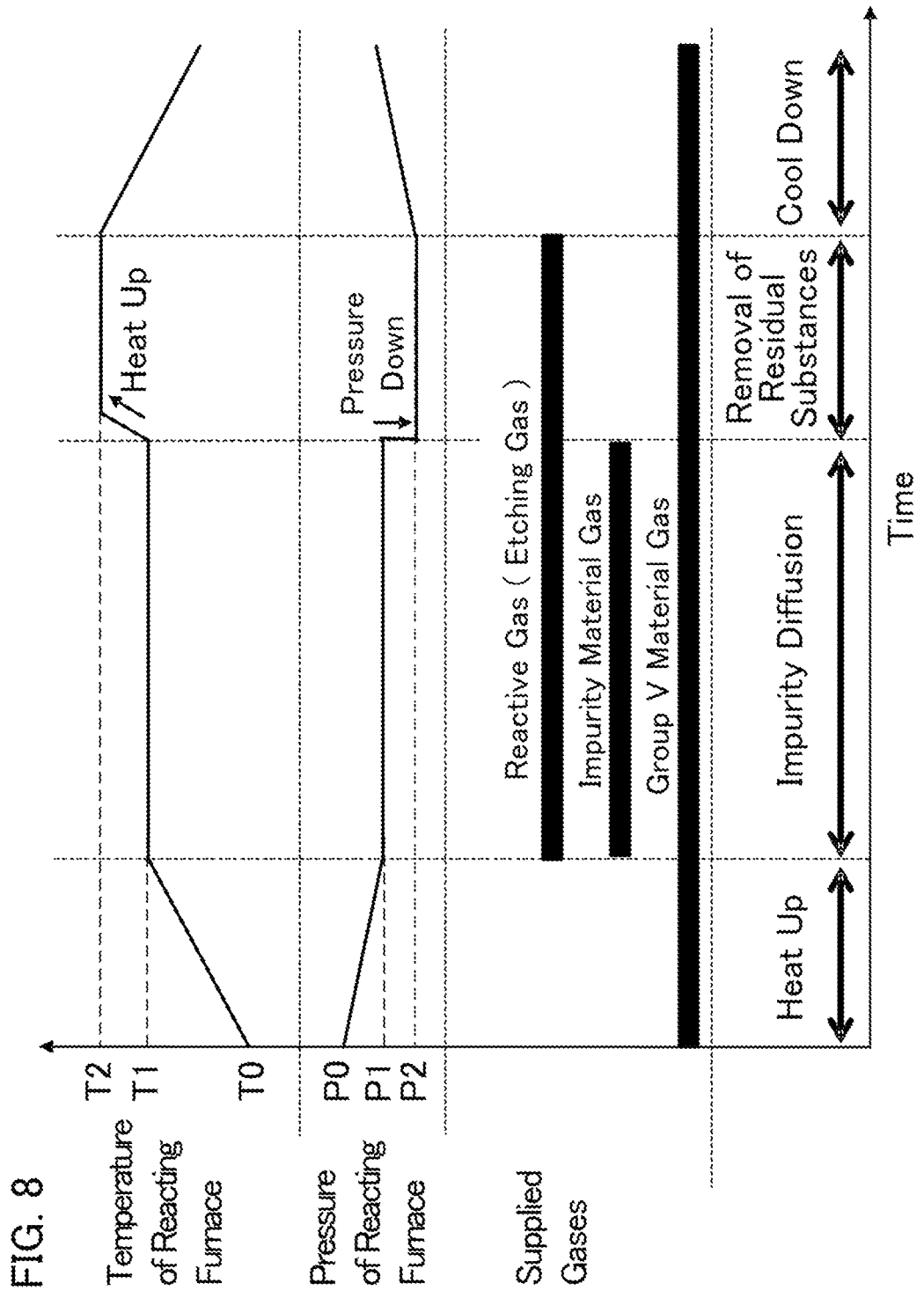
FIG. 8 is a first process flow chart for explaining the principal part of a manufacturing method of a group III-V compound semiconductor device in accordance with Embodiment 4.

FIG. 8 shows a process flow chart for explaining the principal part of the vapor phase diffusion method which is performed in the crystal growth apparatus. When the undoped contact layer 15 and the undoped cladding layer 14 need to be changed into p typed ones, the inside of the furnace is heated up from a temperature T0 to a temperature T1, and the pressure on the inside of the furnace is lowered from a pressure P0 to a pressure P1. Simultaneously with the introduction of the carrier gas ($H_2$), the impurity material gas (diffusion material gas) and the group V material gas and the reactive gas are supplied on the inside of the furnace, and thereby, impurities can be diffused in the undoped contact layer 15 and the undoped cladding layer 14, while the desorption of group V materials is suppressed.

When p type regions are formed in the contact layer 15 and the cladding layer 14, for example, diethyl zinc (Diethyl Zinc: DEZn) or dimethyl zinc (Dimethyl Zinc: DMZn) is used for the impurity material gas. Etching gases of halogen system, such as HCl (hydrogen chloride), $TbCl_3$ (terbium trichloride), and the like, are used for the reactive gas. For example, $AsH_3$ or $PH_3$ is used for the group V material gas. The temperature to perform the diffusion is, for example, 400 to 500° C., and the internal pressure of the reacting furnace 220 is 100 to 700 hPa (100 to 700 mbar).

After the impurity diffusion is carried out for a desired time, with the impurity material gas (diffusion material gas) and the reactive gas being supplied on the inside of the furnace, the supply of the impurity material gas (diffusion material gas) is stopped. Moreover, the inside of the furnace is heated up from the temperature T1 (first temperature) to the temperature T2 (second temperature), to attain a temperature which is higher than that of the diffusion time, and the pressure on the inside of the reacting furnace is lowered from the pressure P1 (first pressure) to the pressure P2 (second pressure), and the state of the furnace is kept for a definite period of time, to remove the residual substances.

For example, in the case where the temperature of the reacting furnace is 450° C. and the pressure is 700 hPa (700 mbar) at the time when the impurity diffusion is performed, the temperature of the reacting furnace is set at 600° C. and the pressure of the reacting furnace is set at 100 hPa (100 mbar). In the process of removing the residual substances, it is preferable that, the temperature of the reacting furnace is raised by at least 50° C. or more, compared with that of the process of impurity diffusion, and the pressure of the reacting furnace is lowered by 50 hPa or more. Also when this residual substance removal process is performed, the reactive gas is introduced. Subsequent to that process, the temperature on the inside of the furnace is lowered slowly, while the pressure on the inside of the furnace is returned to a previous value.

Figure 9:
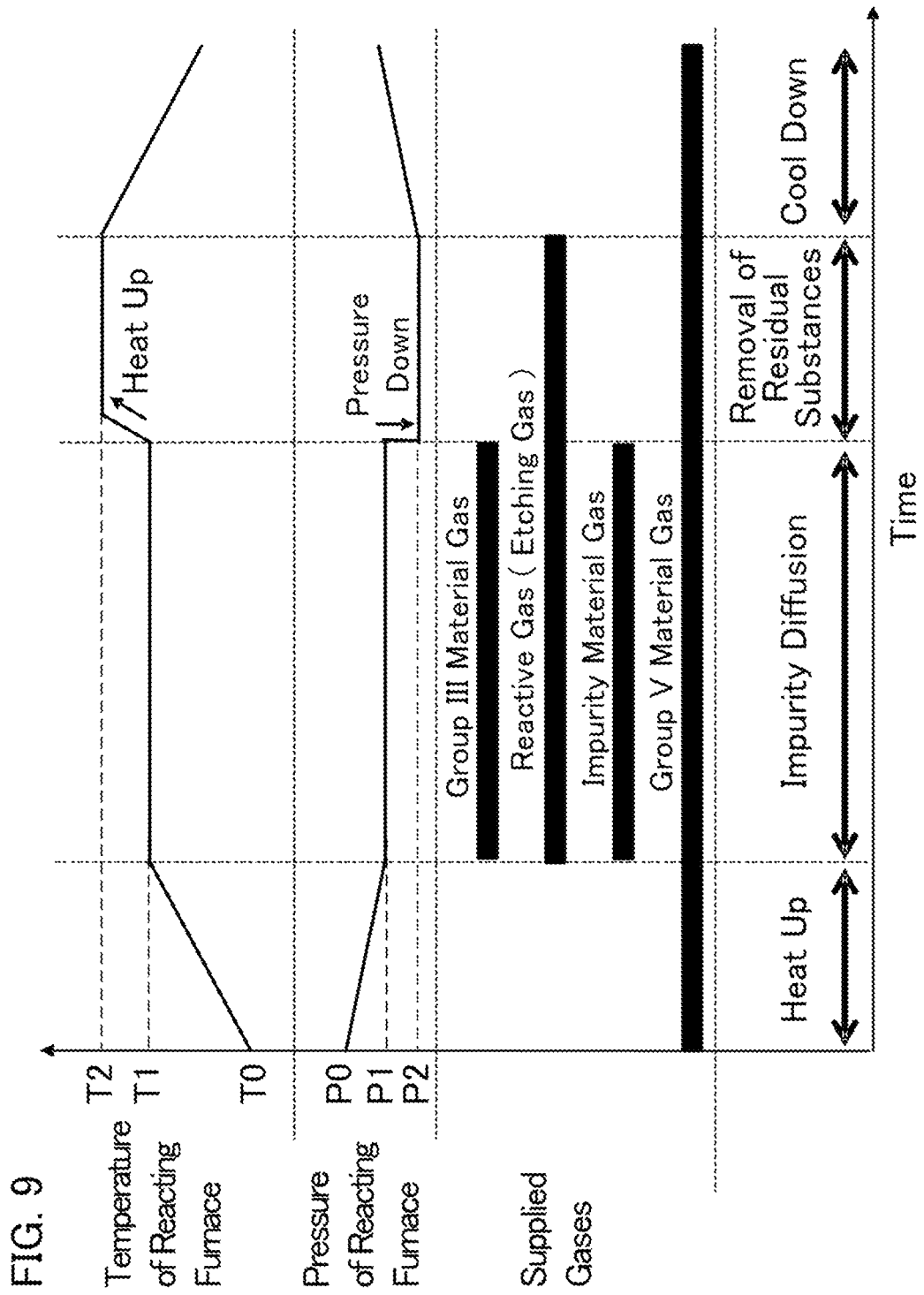
FIG. 9 is a second process flow chart for explaining the principal part of the manufacturing method of a group III-V compound semiconductor device in accordance with Embodiment 4.

The reactive gas (etching gas) is introduced, from the start of the impurity diffusion process, for supplying the impurity gas, and thereby, it becomes possible to dope impurities without inherently generating the deposited materials of the diffusion time. In the case where the compound semiconductor base substrate itself, which is a diffusion target, is grinded by the introduction of the etching gas, the group III material gas is introduced in the impurity diffusion process, as shown in FIG. 9. Crystal growth and etching proceed at the same time by the introduction of the group III material gas, and then, the residual substances are removed. The present embodiment makes it possible to further improve the controllability, compared with the case where, after the diffusion process is finished, the residual substance removal process is proceeded.

The present embodiment is related with the manufacturing method of a compound semiconductor device, which is provided with a process in which, in the process of doping impurities by the vapor phase diffusion method, when the group V material gas and the impurity material gas are supplied on the inside of a heated-up reacting furnace, the etching gas is also introduced at the same time. Further, the present embodiment is related with the manufacturing method of a compound semiconductor device, in which, when the group V material gas and the impurity material gas and the etching gas are supplied on the inside of the heated-up reacting furnace, the group III material gas is supplied at the same time.

Embodiment 5

The manufacturing method of a group III-V compound semiconductor device in accordance with Embodiment 5 includes a diffusion process of impurities, in which, simultaneously with the introduction of 112 of the carrier gas, the impurity material gas (for example, DEZn or DMZn) and the group V material gas (for example, AsH$_3$ or PH$_3$) and the reactive gas are supplied on the inside of the furnace, and thereby, the desorption of group V materials is suppressed, and then, impurities can be doped, while the semiconductor crystalline nature is secured. The group III material gas may be introduced at the same time.

First of all, after an n type InP cladding layer 12 is formed on an n type InP base substrate 11, an active layer 13 is grown thereon. Subsequent to this process, a cladding layer 14 (i-InP cladding layer) and a contact layer 15 (i-InGaAs contact layer or i-InGaAsP contact layer), in both of which impurities are not doped intentionally, will be stacked thereon. Subsequent to this process, the group V material gas, the impurity material gas, the carrier gas (H$_2$), and the reactive gas are introduced on the inside of the reacting furnace 220, and impurity diffused layers are produced by the vapor phase diffusion method.

Figure 10:
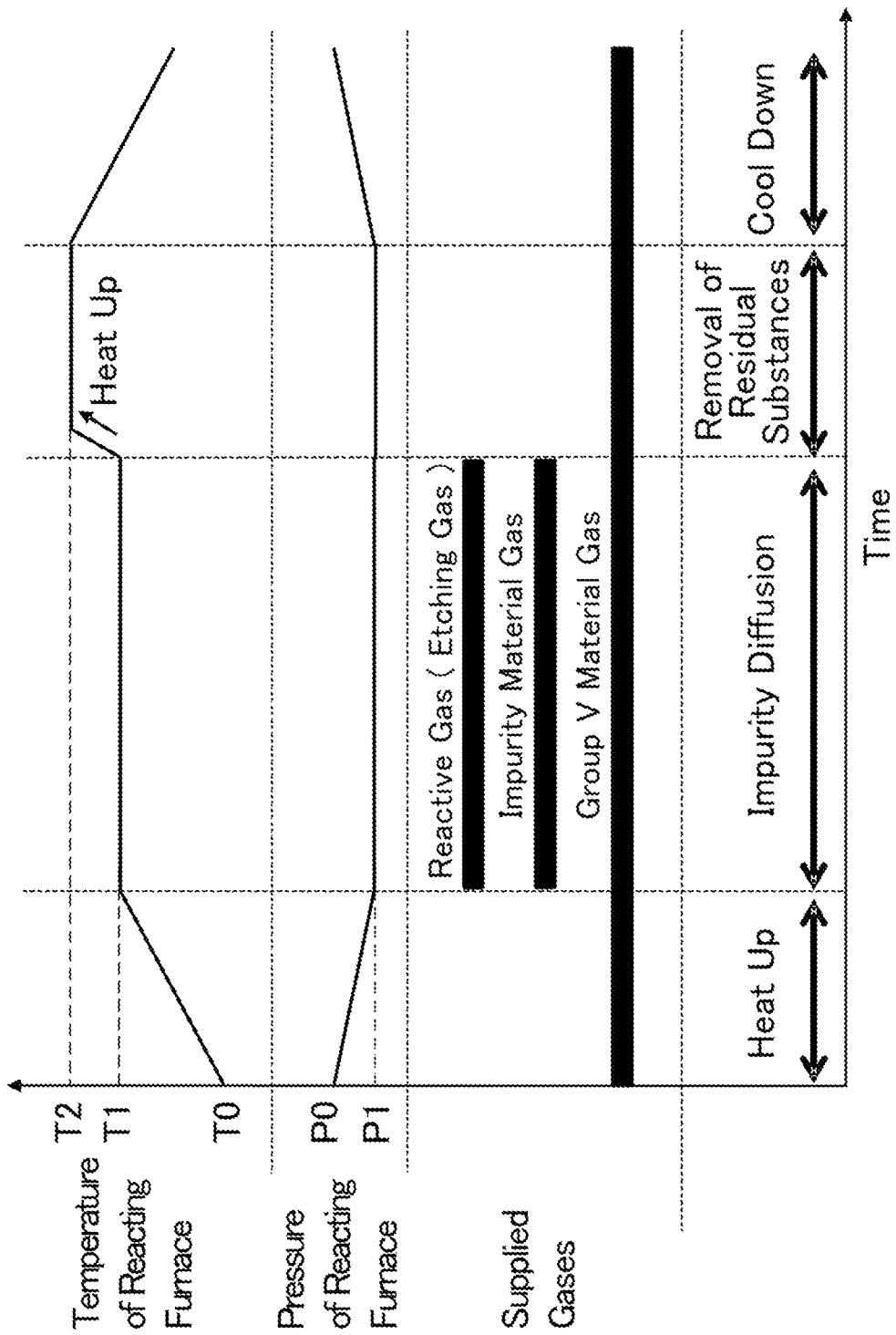
FIG. 10 is a first process flow chart for explaining the principal part of a manufacturing method of a group III-V compound semiconductor device in accordance with Embodiment 5.

FIG. 10 shows a process flow chart for explaining the principal part of the vapor phase diffusion method which is performed in the crystal growth apparatus. When the undoped contact layer 15 and the undoped cladding layer 14 need to be changed into p typed ones, the inside of the furnace is heated up from a temperature T0 to a temperature T1, and the pressure on the inside of the furnace is lowered from a pressure P0 to a pressure P1, to attain the state of a reduced pressure, rather than that of an atmospheric pressure. Simultaneously with the introduction of the carrier gas (H$_2$), the impurity material gas (diffusion material gas) and the group V material gas and the reactive gas (etching gas) are supplied on the inside of the furnace, and thereby, impurities can be diffused in the undoped contact layer 15 and the undoped cladding layer 14.

When p type regions are formed in the undoped contact layer 15 and the undoped cladding layer 14, for example, diethyl zinc (Diethyl Zinc: DEZn) or dimethyl zinc (Dimethyl Zinc: DMZn) is used for the impurity material gas. For example, AsH$_3$ or PH$_3$ is used for the group V material gas. Etching gases of halogen system, such as HCl (hydrogen chloride), TbCl$_3$ (terbium trichloride), and the like, are used for the reactive gas. The temperature to perform the diffusion is, for example, 400 to 500° C., and the internal pressure of the reacting furnace 220 is 100 to 700 hPa (100 to 700 mbar).

The impurity diffusion is carried out for a desired time, with the group V material gas and the impurity material gas (diffusion material gas) and the reactive gas being supplied on the inside of the furnace. Subsequent to this process, the supply of the impurity material gas (diffusion material gas) and the reactive gas is stopped, and further, the temperature on the inside of the furnace is raised from a temperature T1 (first temperature) to a temperature T2 (second temperature), to attain a temperature which is higher than that of the diffusion time. For example, in the case where the temperature of the reacting furnace is 450° C. at the time when the impurity diffusion is performed, the temperature of the reacting furnace is set at 600° C. In the process of removing the residual substances, it is preferable that, the temperature on the inside of the reacting furnace is raised by at least 50° C. or more, compared with that of the process of impurity diffusion. Subsequent to this process, the temperature on the inside of the furnace is lowered slowly, while the pressure on the inside of the furnace is returned to an atmospheric pressure.

Figure 11:
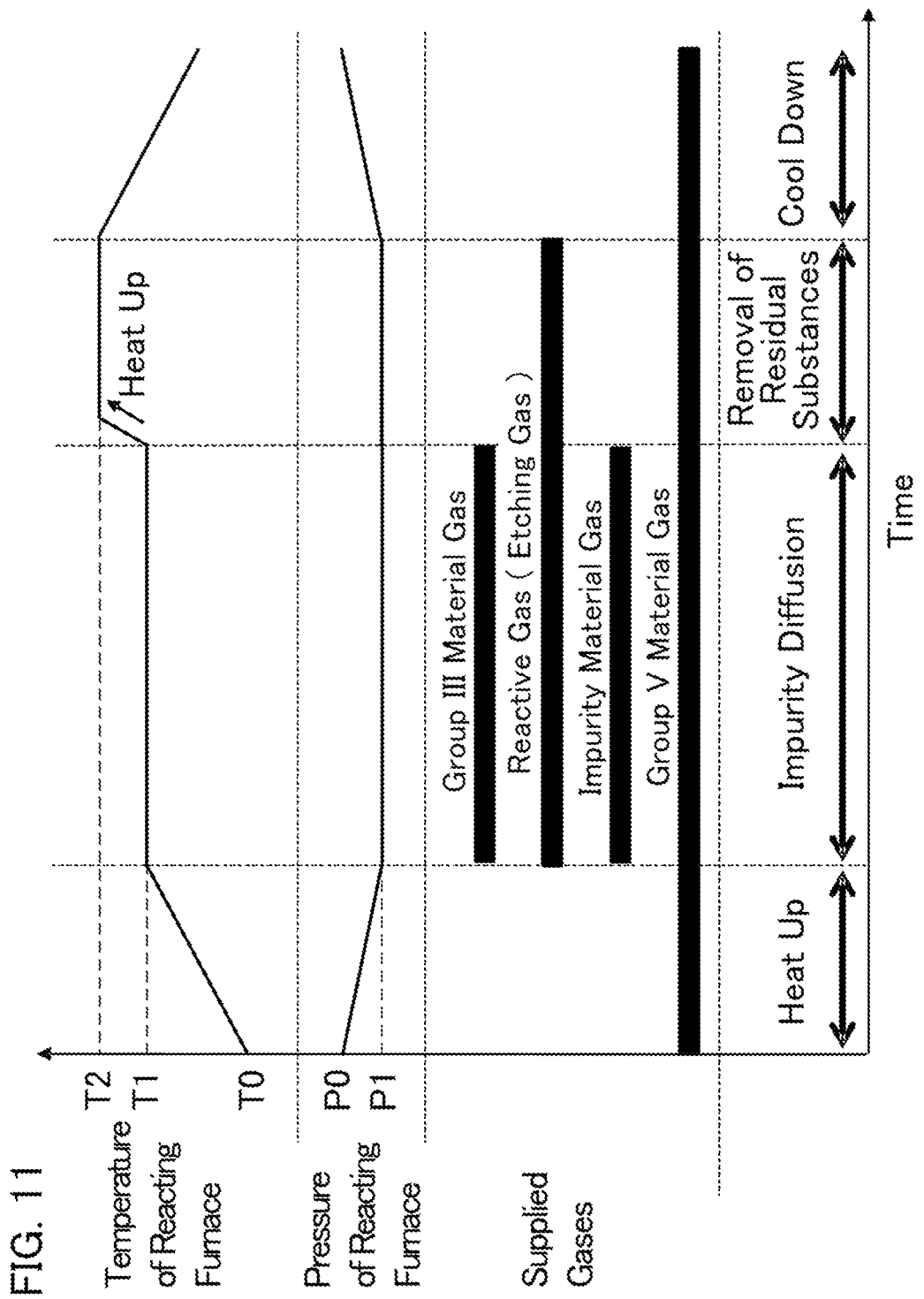
FIG. 11 is a second process flow chart for explaining the principal part of the manufacturing method of a group III-V compound semiconductor device in accordance with Embodiment 5.

The reactive gas (etching gas) is introduced, from the start of the impurity diffusion process, for supplying the impurity gas, and thereby, it becomes possible to dope impurities without inherently generating the deposited materials of the diffusion time. In the case where the compound semiconductor base substrate itself, which is a diffusion target, is grinded by the introduction of the etching gas, the group III material gas is introduced, as shown in FIG. 11. Crystal growth and etching proceed at the same time by the introduction of the group III material gas, and then, the residual substances are removed.

The present embodiment is related with the manufacturing method of a compound semiconductor device, which is provided with a process in which, in the process of doping impurities by the vapor phase diffusion method, when the group V material gas and the impurity material gas are supplied on the inside of a heated-up reacting furnace, the etching gas is also introduced at the same time. Further, the present embodiment is related with the manufacturing method of a compound semiconductor device, in which, when the group V material gas and the impurity material gas and the etching gas are supplied on the inside of the heated-up reacting furnace, the group III material gas is supplied at the same time.

Embodiment 6

The manufacturing method of a group III-V compound semiconductor device in accordance with Embodiment 6 includes a diffusion process of impurities, in which, simultaneously with the introduction of 112 of the carrier gas, the impurity material gas (for example, DEZn and DMZn) and the group V material gas (for example, $AsH_3$ or $PH_3$) and the reactive gas are supplied on the inside of the furnace, and thereby, the desorption of group V materials is suppressed, and then, impurities are doped, while the semiconductor crystalline nature is secured. The group III material gas may be introduced at the same time.

First of all, after an n type InP cladding layer 12 is formed on an n type InP base substrate 11, an active layer 13 is grown thereon. Subsequent to this process, a cladding layer 14 (i-InP cladding layer) and a contact layer 15 (i-InGaAs contact layer or i-InGaAsP contact layer), in both of which impurities are not doped intentionally, will be stacked thereon. Subsequent to this process, the group V material gas, the impurity material gas, the carrier gas ($H_2$), and the reactive gas are introduced on the inside of the reacting furnace 220, and impurity diffused layers are produced by the vapor phase diffusion method.

Figure 12:
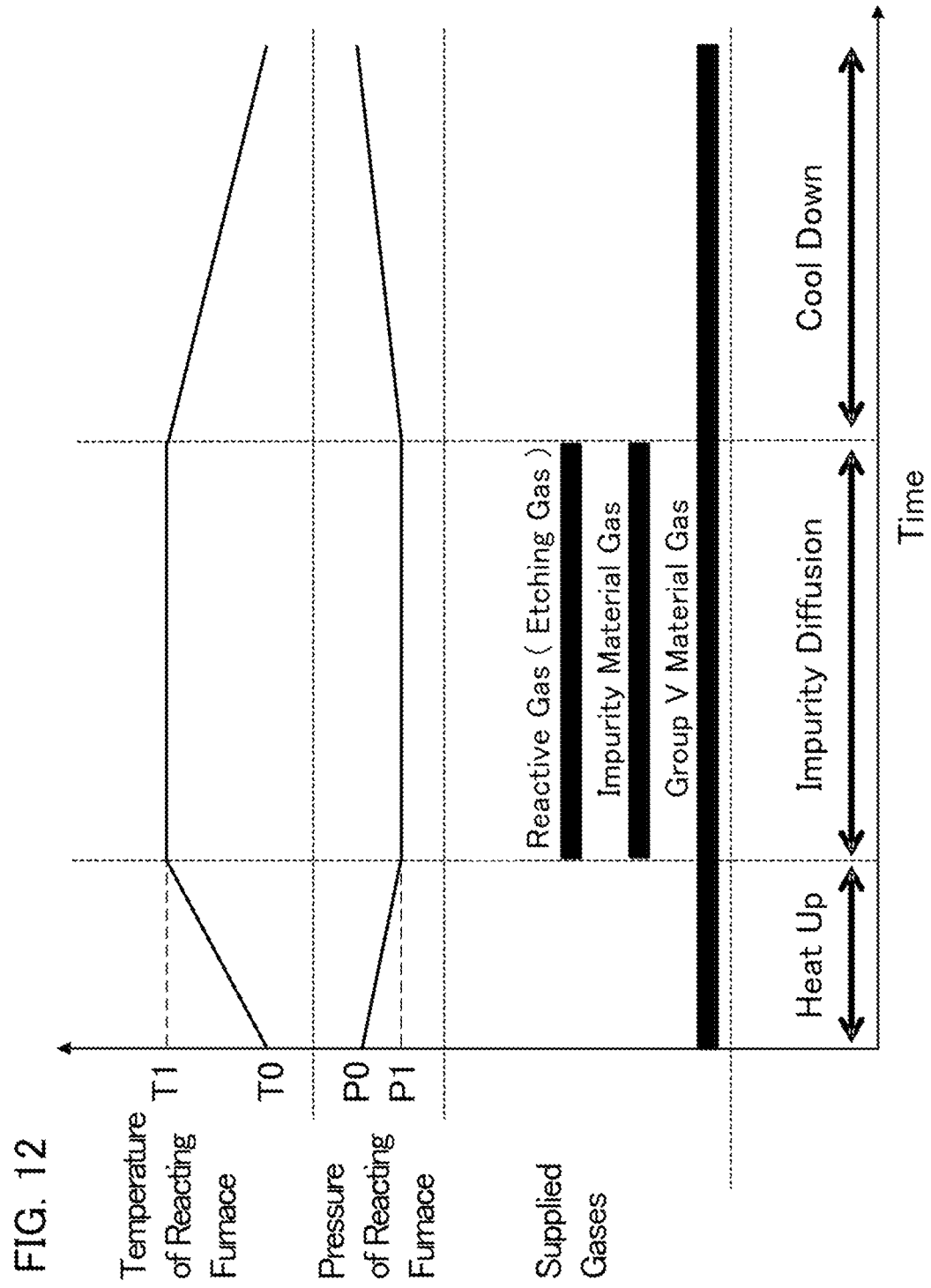
FIG. 12 is a first process flow chart for explaining the principal part of a manufacturing method of a group III-V compound semiconductor device in accordance with Embodiment 6.

FIG. 12 shows a process flow chart for explaining the principal part of the vapor phase diffusion method which is performed in the crystal growth apparatus. When the undoped contact layer 15 and the undoped cladding layer 14 need to be changed into p typed ones, the temperature on the inside of the furnace is raised from a temperature T0 to a temperature T1 (first temperature), and the pressure on the inside of the furnace is lowered from a pressure P0 to a pressure P1 (first pressure), to attain the state of a reduced pressure, rather than that of an atmospheric pressure.

Simultaneously with the introduction of the carrier gas ($H_2$), the impurity material gas (diffusion material gas) and the group V material gas and the reactive gas are supplied on the inside of the furnace, and thereby, impurities can be diffused in the undoped contact layer 15 and the undoped cladding layer 14 (first process).

When p type regions are formed in the contact layer 15 and the cladding layer 14, for example, diethyl zinc (Diethyl Zinc: DEZn) or dimethyl zinc (Dimethyl Zinc: DMZn) is used for the impurity material gas. Etching gases of halogen system, such as HCl (hydrogen chloride), $TbCl_3$ (terbium trichloride), and the like, are used for the reactive gas. For example, $AsH_3$ or $PH_3$ is used for the group V material gas. The temperature to perform the diffusion is, for example, 400 to 500° C., and the internal pressure of the reacting furnace 220 is 100 to 700 hPa (100 to 700 mbar).

The impurity diffusion is carried out for a desired time, with the group V material gas and the impurity material gas (diffusion material gas) and the reactive gas being supplied on the inside of the furnace. Subsequent to this process, the supply of the impurity material gas (diffusion material gas) and the reactive gas is stopped, and the temperature on the inside of the furnace is lowered slowly, while the pressure on the inside of the furnace is returned to a previous value. Simultaneously with the introduction of the carrier gas ($H_2$), the impurity material gas and the group V material gas and the reactive gas are supplied on the inside of a furnace, and thereby, the desorption of group V materials is suppressed, and then, impurities can be diffused, while the semiconductor crystalline nature is secured.

Figure 13:
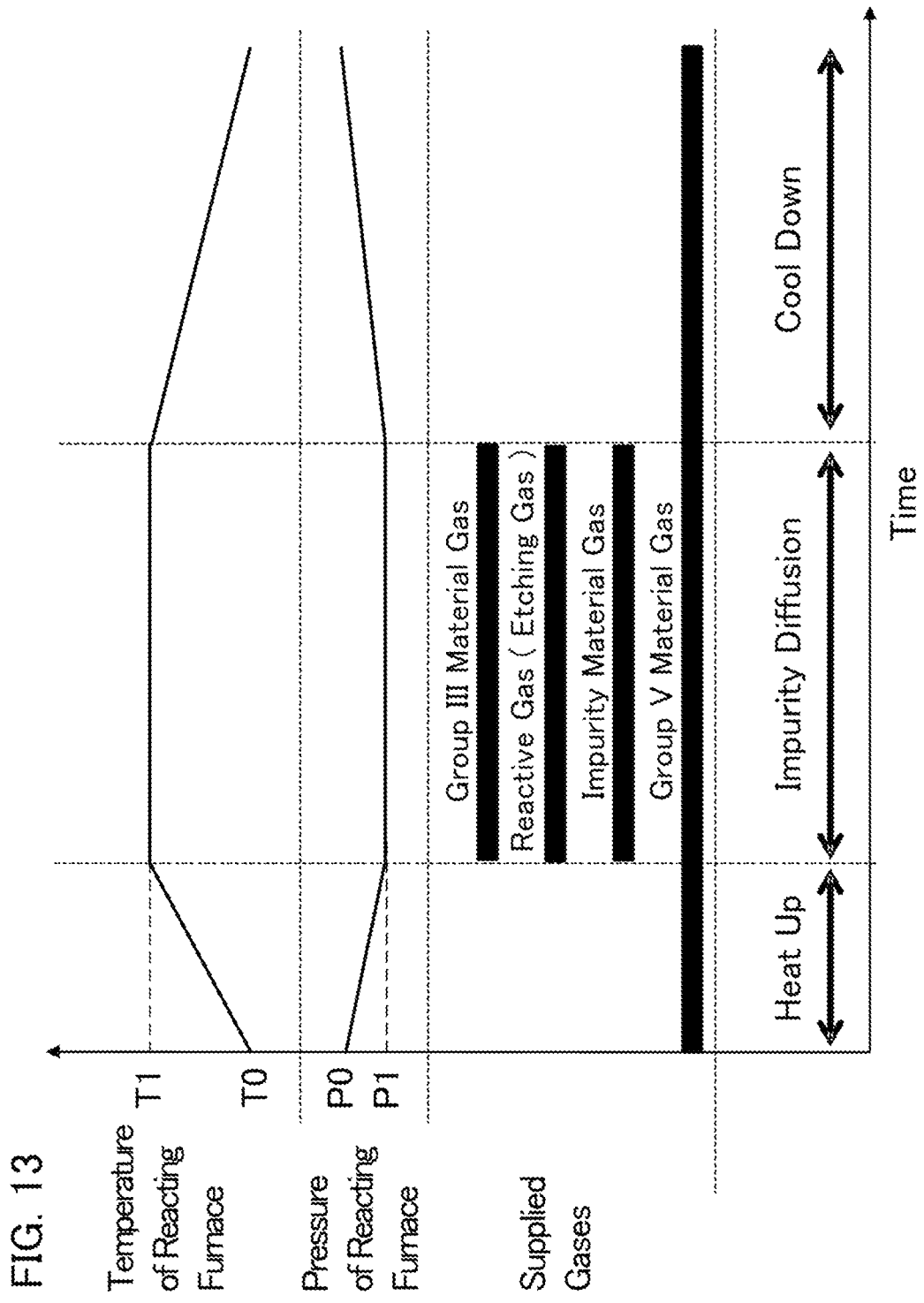
FIG. 13 is a second process flow chart for explaining the principal part of the manufacturing method of a group III-V compound semiconductor device in accordance with Embodiment 6.

The reactive gas (etching gas) is introduced, from the start of the impurity diffusion process, for supplying the impurity gas, and thereby, it becomes possible to dope impurities without inherently generating the deposited materials of the diffusion time. In the case where the compound semiconductor base substrate itself, which is a diffusion target, is grinded by the introduction of the etching gas, the group III material gas is introduced, as shown in FIG. 13. Crystal growth and etching proceed at the same time by the introduction of the group III material gas, and then, the residual substances are removed. The present embodiment makes it possible to further improve the controllability, compared with the case where, after the diffusion process is finished, the residual substance removal process is proceeded.

The present embodiment is related with the manufacturing method of a compound semiconductor device, which is provided with a process in which, in the process of doping impurities by the vapor phase diffusion method, when the group V material gas and the impurity material gas are supplied on the inside of a heated-up reacting furnace, the etching gas is also introduced at the same time. Further, the present embodiment is related with the manufacturing method of a compound semiconductor device, in which, when the group V material gas and the impurity material gas and the etching gas are supplied on the inside of the heated-up reacting furnace, the group III material gas is supplied at the same time.

The manufacturing method of the group III-V compound semiconductor device which is disclosed in the present embodiment, is the one which is provided with a first process in which, the group V material gas and the impurity material gas and the etching gas are supplied to a reacting furnace set at a first temperature, and impurities are doped in an undoped group III-V compound semiconductor layer. Further, the present embodiment is related with the manufacturing method of a group III-V compound semiconductor device, which has a feature in that, in the first process, the group III material gas is further supplied, in addition to the supply of the group V material gas and the impurity material gas and the etching gas.

It is to be noted that, in the above mentioned embodiments, explained is a method by the vapor phase diffusion method, to manufacture a semiconductor laser in which group III-V compound semiconductor is used. The embodiments of the present application do not limit the kinds of devices, materials to be used, and others, and they are disclosures featured in that, impurity residual substances generated by the vapor phase diffusion method are removed within the reacting furnace. The kinds and structure of devices, the kinds of impurity material gases used in the diffusion, and others can be changed appropriately.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

EXPLANATION OF NUMERALS AND SYMBOLS

11 N type InP base substrate, 12 N type InP cladding layer, 13 Active layer, 14 Cladding layer, 15 Contact layer, 16 Insulating mask, 100 Optical semiconductor device, 200

Vapor phase growth apparatus, 210 Air exhaust, 220 Reacting furnace, 230 Heater, 240 Mass flow controller, 250 Gas container, 250*a* Carrier gas, 250*b* Group III material gas, 250*c* Etching gas, 250*d* Group V material gas, 250*e* Impurity material gas

What is claimed is:

1. A manufacturing method of a group III-V compound semiconductor device, the method comprising:
   a first process in which a group V material gas and an impurity material gas are supplied to a reacting furnace which is set at a first temperature of a range from 400° C. to 500° C. and a first pressure of a range from 100 hPa to 700 hPa, and an undoped group III-V compound semiconductor layer is thereby doped, and
   a second process in which the supply of the impurity material gas is stopped, a temperature of the reacting furnace is raised to a second temperature which is higher than the first temperature, a pressure of the reacting furnace is set lower than a pressure of the first pressure, a supply of an etching gas is initiated and the supply of the group V material gas is continued.

2. The manufacturing method of the group III-V compound semiconductor device according to claim 1, wherein the second temperature is higher by 50° C. or more than the first temperature.

3. The manufacturing method of the group III-V compound semiconductor device according to claim 1, wherein the pressure in the second process is lower by 50 hPa or more than the first pressure.

4. The manufacturing method of the group III-V compound semiconductor device according to claim 1, wherein the etching gas is a halogenated reactive gas.

5. The manufacturing method of the group III-V compound semiconductor device according to claim 1, wherein the impurity material gas which is supplied in the first process employs dimethyl zinc or diethyl zinc.

6. A manufacturing method of a group III-V compound semiconductor device, the method comprising:
   a first process in which a group V material gas, an impurity material gas and a halogenated reactive gas as an etching gas are supplied to a reacting furnace which is set at a first temperature of a range from 400° C. to 500° C. and a first pressure of a range from 100 hPa to 700 hPa, and an undoped group III-V compound semiconductor layer is thereby doped, and
   a second process in which the supply of the impurity material gas is stopped, a temperature of the reacting furnace is raised to a second temperature which is higher than the first temperature, a pressure of the reacting furnace is set lower than a pressure of the first pressure, the supply of the group V material gas and the supply of the etching gas are continued.

7. The manufacturing method of the group III-V compound semiconductor device according to claim 6, wherein the impurity material gas which is supplied in the first process employs dimethyl zinc or diethyl zinc.

8. A manufacturing method of a group III-V compound semiconductor device, the method comprising:
   a first process in which a group V material gas, an impurity material gas and a halogenated reactive gas as an etching gas are supplied to a reacting furnace which is set at a first temperature of a range from 400° C. to 500° C. and a first pressure of a range from 100 hPa to 700 hPa, and an undoped group III-V compound semiconductor layer is thereby doped, and
   a second process in which the supply of the impurity material gas and the supply of the etching gas are stopped, a temperature of the reacting furnace is raised to a second temperature which is higher than the first temperature and the supply of the group V material gas is continued.

9. The manufacturing method of the group III-V compound semiconductor device according to claim 8, wherein the impurity material gas which is supplied in the first process employs dimethyl zinc or diethyl zinc.

\* \* \* \* \*